United States Patent
Edamura

(10) Patent No.: US 7,217,948 B2
(45) Date of Patent: May 15, 2007

(54) SEMICONDUCTOR SUBSTRATE

(75) Inventor: Tadataka Edamura, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 317 days.

(21) Appl. No.: 10/947,354

(22) Filed: Sep. 23, 2004

(65) Prior Publication Data
US 2005/0067614 A1 Mar. 31, 2005

(30) Foreign Application Priority Data
Sep. 29, 2003 (JP) ............................ P2003-338152

(51) Int. Cl.
H01L 29/06 (2006.01)
(52) U.S. Cl. .......................................... 257/14; 257/22
(58) Field of Classification Search .................. 257/14, 257/17, 21, 22; 438/962
See application file for complete search history.

(56) References Cited

U.S. PATENT DOCUMENTS 5,463,518 A * 10/1995 Otomo et al. ................ 505/171
7,042,004 B2 * 5/2006 Magnus et al. ................ 257/31

OTHER PUBLICATIONS

Raz, T., et al., "Formation of InAs self-assembled quantum rings on InP", Applied Physics Letters, vol. 82, No. 11, Mar. 17, 2003, pp. 1706-1708.*
Granados, D., et al., "In(Ga)As self-assembled quantum ring formation by molecular beam epitaxy", Applied Physics Letters, vol. 82, No. 15, Apr. 14, 2003, pp. 2401-2403.*
Y. Arakawa et al., *Multidimensional quantum well laser and temperature dependence of its threshold current*, Appl. Phys. Let., vol. 40, 1982, pp. 939-941.
Y. Sugiyama et al., *Stacked InAs Self-Assembled Quantum Dots on (001) GaAs Grown by Molecular Beam Epitaxy*, Jpn. J.Appl. Phys., vol. 35, 1996, pp. 1320-1324.
A. Lorke et al., *Spectroscopy of Nanoscopic Semiconductor Rings*, Physical Review Letters, vol. 84, No. 10, Mar. 6, 2000, pp. 2223-2226.
K. Suzuki et al., *Density Control of GaSb/GaAs Self-assembled Quantum Dots (~25nm) Grown by Molecular Beam Epitaxy*, Jpn. J. Appl. Phys. vol. 37, Part 2, No. 2B, Feb. 15, 1998, pp. L-203-L-205.

* cited by examiner

Primary Examiner—Sara W. Crane
(74) Attorney, Agent, or Firm—Drinker Biddle & Reath LLP

(57) ABSTRACT

The present invention relates to a preferred semiconductor substrate for the production of devices. The semiconductor substrate is comprised of GaAs. Then, a plurality of quantum rings, which are composed of GaSb and have a substantially elliptical shape with an aspect ratio of 2 or more but 5 or less, are formed on a surface of the semiconductor substrate. These quantum rings extend along in the substantially same direction. In a case where a light beam is irradiated onto the surface of the semiconductor substrate, among the polarized components of the irradiated light, one polarized component parallel to the long-axis direction of the ellipse that is an extending direction of each quantum ring is reflected, while another polarized component parallel to the short-axis direction thereof is transmitted. That is, the semiconductor substrate reflects one polarized component, and transmits the other polarized component. A conventional semiconductor substrate having quantum rings of a substantially true circle shape with an aspect ratio of nearly 1 could not achieve the above separation of the polarized components. Therefore, the semiconductor substrate according to the present invention is preferred to the application to polarizing devices which was difficult in the conventional substrate.

8 Claims, 4 Drawing Sheets

SEMICONDUCTOR SUBSTRATE

BACKGROUND OF THE INVENTION

1. Field of the Invention

The present invention relates to a semiconductor substrate, and more specifically, to a semiconductor substrate suitable to a polarizing element.

2. Related Background Art

In recent years, a study concerning quantum dots that is an ultrafine low-dimensional structure with a metal or semiconductor is carried out earnestly. Such a study has an object to realize a device having an excellent performance as is not found hitherto by using a quantum effect to be exhibited when electrons or holes are confined in a three-dimensional space. It is focused more and more with rapid development of nanotechnology in recent years. As a three-dimensional quantum confining structure, a concept of the "quantum dots" was first disclosed by Document 1: Y. Arakawa and H. Sakaki, "Multidimensional quantum well laser and temperature dependence of its threshold current", Appl. Phys. Lett., Vol. 40, 1982, pp. 939. However, under the study circumstances at the very proposed time, the concept was not beyond the field of theoretical prediction. Thus, it was considered that the achievement of such devices was difficult. However, the quantum dots can be currently formed by several methods such as a microfabrication employing EB exposure and X-rays exposure, a selective growth onto a processed substrate, and self-assembly based on a three-dimensional island-shape growth in a molecular beam epitaxial (MBE) method owing to remarkable technological innovation concerning fine structures.

Here, in a method of forming quantum dots by a microfabrication using an exposure technology among the above specified methods, there is a problem such that a condition at an after-process growth boundary surface is poor since it is difficult to avoid process damage. Since this process damage may cause deterioration of characteristics, it is difficult to evaluate a variety of quantum effect characteristics with excellent precision in a substrate that is subjected to much process damage. In addition, there is a problem such that process steps are extremely complicated in a method of forming quantum dots by selective growth, which requires plenty of time and cost upon fabrication of the quantum dots.

For this reason, a method of forming quantum dots by self-assembly employing the MBE method is now becoming a main stream. This is because quantum dots of high quality, almost free from process damage, can be formed relatively easily by use of this method. This self-assembly technique is disclosed in Document 2: Y. Sugiyama et al. "Stacked InAs Self-Assembled Quantum Dots on (001) GaAs Grown by Molecular Beam Epitaxy", Jpn. J. Appl. Phys., Vol. 35, 1996, pp. 1320, for example. That is, InAs quantum dots are formed on a GaAs substrate by using a three-dimensional island-shape growth mechanism caused by lattice mismatch (approximately 7.1%) between the GaAs substrate and InAs. It is directly confirmed by observations using an atomic force microscope and so on that the configuration of the quantum dots is formed in a semisphere lens shape of about several tens nanometer in diameter. The area density of the quantum dots generated on the substrate at random is approximately $10^{10}$ cm$^{-2}$.

On the other hand, ring-shaped InAs quantum dots self-assembled on a GaAs substrate is disclosed in Document 3: A. Lorke et al, "Spectroscopy of Nanoscopic Semiconductor Rings", Phys. Rev. Lett., Vol. 84, 2000, pp. 2223. In accordance with Document 3, InAs quantum dots are first formed on a GaAs substrate by a conventional method. The quantum dots are subjected to a thermal treatment after covered with a thin GaAs layer having the same height as that of the dots, and thereby the quantum dots are formed in a caldera-shape such that the top of the dots is caved in, which is caused by diffusion of InAs.

SUMMARY OF THE INVENTION

With respect to the above-mentioned semiconductor substrate, study concerning the application to actual devices is still insufficient. The inventors succeeded to produce a preferred substrate for the production of specific devices from their earnest study.

The present invention is made in view of such circumstances, and it is an object to provide a preferred semiconductor substrate for the production of devices.

A semiconductor substrate according to the present invention is comprised of a first compound semiconductor, and having a surface on which a plurality of quantum rings, which are comprised of a second compound semiconductor different from the first compound semiconductor, are provided. In particular, in the semiconductor substrate according to the invention, each of the quantum rings has a substantially elliptical shape with an aspect ratio of 2 or more but 5 or less, and extends in the substantially same direction.

A semiconductor substrate according to the present invention, the body is comprised of the first compound semiconductor. And, a plurality of quantum rings comprised of the second semiconductor and each having an elliptical shape with the aspect ratio of 2 or more but 5 or less are provided on the surface of the body. These quantum rings extend in the substantially same direction. In a case where a light beam is irradiated to the surface of the semiconductor, among the polarized components of the irradiated light, one polarized component parallel to the long-axis direction of the ellipse that is an extending direction of the quantum ring is reflected, while another polarized component parallel to the short-axis direction thereof is transmitted. That is, the semiconductor substrate according to the present invention has a function of reflecting the polarized component in the extending direction of the quantum ring and transmitting any polarized component only perpendicular to the polarized component. A conventional semiconductor substrate having quantum rings of a substantially true circle shape with an aspect ratio of nearly 1 cannot achieve the above separation of the polarized component. Therefore, the semiconductor substrate according to the present invention is preferred to applications to polarizing devices that transmits selectively one polarized component only, which was difficult in the conventional substrate. Note that in the specification the "quantum ring" means quantum dots having a ring shape, which includes a caldera-shaped quantum dots of which the top is concave and a wall-shaped quantum dots projecting from a planar surface.

In addition, it is preferable that the first compound semiconductor is a Group III-V compound semiconductor containing GaAs. It is preferable that the above second compound semiconductor is a Group III-V compound semiconductor containing GaSb.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

In the following, embodiments of the semiconductor substrate will be explained in detail with reference to FIGS. 1 to 4. In the explanation of the drawings, the same elements will be denoted by the same reference symbols and these redundant descriptions will be omitted.

Figure 1:
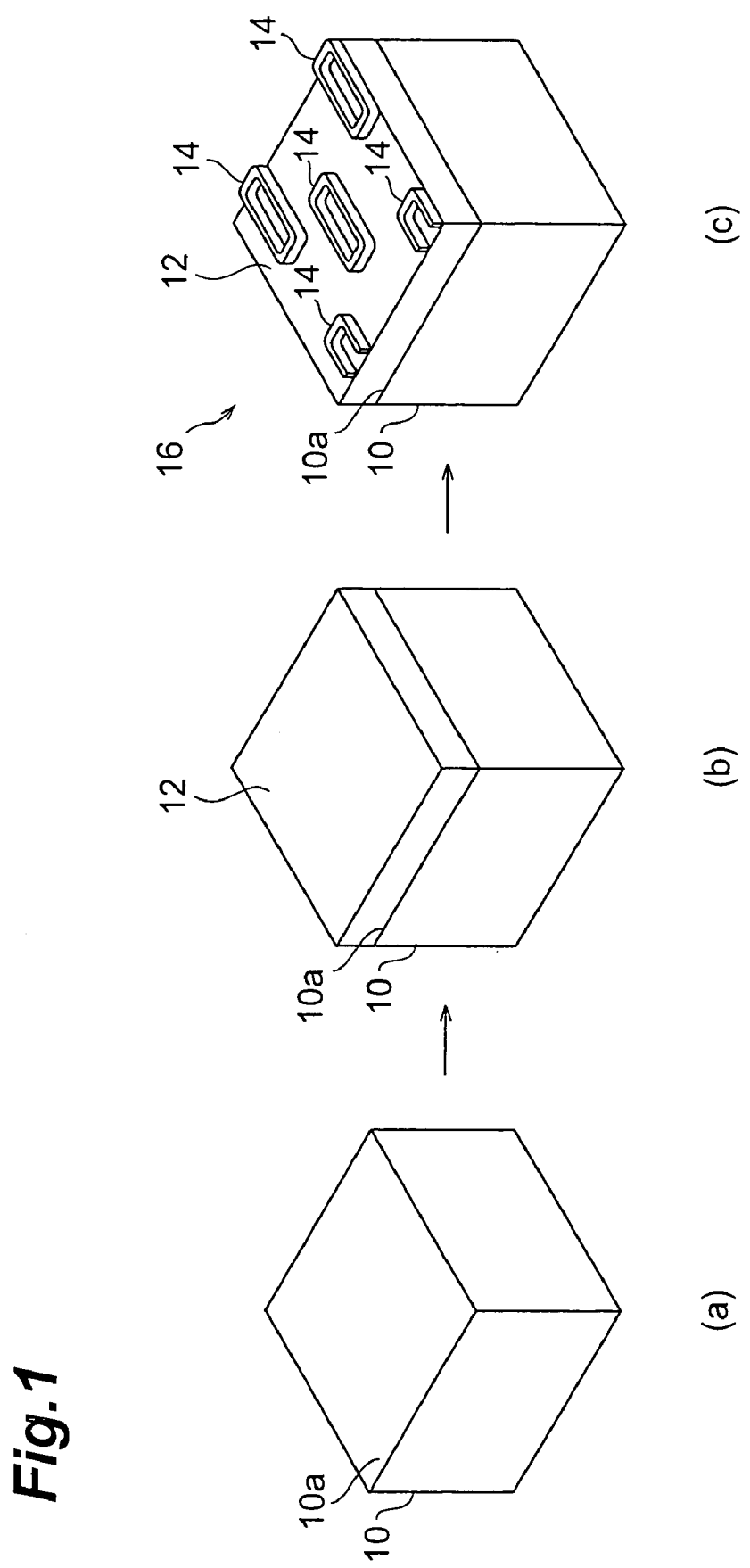
FIG. 1 is a view showing a procedure for fabricating an embodiment of a semiconductor substrate according to the present invention.

Referring to FIG. 1, a procedure for fabricating a semiconductor substrate according to the present invention will be explained. FIG. 1 is a view showing a procedure for fabricating an embodiment of a semiconductor substrate according to the present invention. As shown in (a) of FIG. 1, a single-crystal substrate 10 composed of GaAs (first compound semiconductor), in which a (100) surface is exposed on a surface 10a, is prepared, and the single-crystal substrate 10 is introduced in a solid source molecular beam epitaxy apparatus (not shown). And, as shown in (b) of FIG. 1, under the condition of the substrate temperature of 560° C., a GaAs buffer layer 12 is grown on the surface 10a of the single-crystal substrate 10 by about 100 nm, thereby obtaining a GaAs substrate that is a main body. Subsequently, the substrate temperature is decreased to 450° C., and then GaSb (second compound semiconductor) is grown by 3.5 ML (molecular layer) on the resultant GaAs substrate. The growing condition of such GaSb is a V/III ratio of 10 and the growing rate is 0.28 ML/sec. There is a large lattice mismatch of about 7.8% between GaAs and GaSb. Accordingly, GaSb will be grown three-dimensionally in an island-shape when grown on the GaAs substrate. That is, when GaSb is grown three-dimensionally under the above-mentioned condition, as shown in (c) of FIG. 1, quantum dots 14 are formed on the single-crystal substrate 10. The fabrication of the semiconductor substrate 16 is completed through the above process steps.

Figure 2:
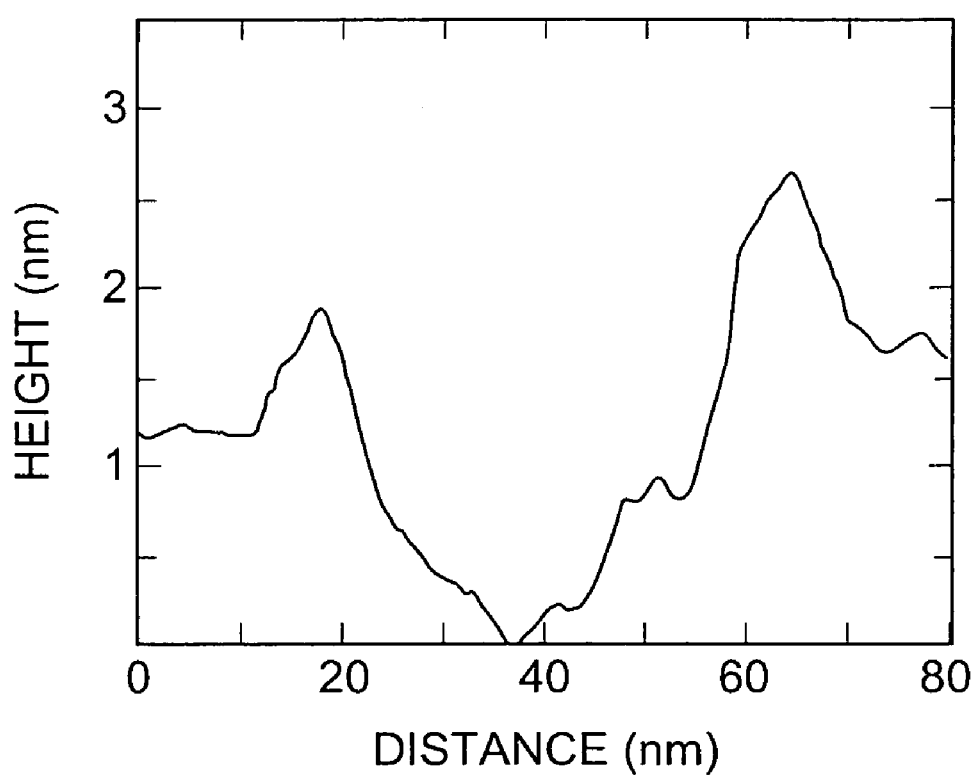
FIG. 2 is a graph showing a cross-section of the GaSb grown on a GaAs substrate that is a main body.

When GaSb was grown on the GaAs substrate, the appearance of the growth was observed by a structure analysis method based on High Energy Diffraction (RHEED). As a result, it was confirmed that at the moment when GaSb was just grown up to 1.6 to 1.7 ML, RHEED patterns changed from linear patterns to dot-shape patterns. Such a pattern change indicates that after continuing the growth at a two-dimensional mode while maintaining planarization of the crystal surface up to about 1.6–1.7 ML, GaSb changes to a three-dimensional growth mode. The cross-sectional shape of the GaSb thus grown with changing to the three-dimensional growth mode is observed by use of an atomic force microscopy (AFM). The results are shown in FIG. 2. FIG. 2 is a graph showing the cross-section shape of GaSb grown on the GaAs substrate. In this graph, the horizontal axis represents a distance (nm) from a predetermined position, while the vertical axis represents a height (nm) from a lowest point. As can be seen from FIG. 2, it is assumed that GaSb grown on the GaAs substrate is ring-shaped quantum dots (quantum ring), such that the top of the bump-shaped dots is concave, and not bump-shaped quantum dots.

Thus, it was confirmed that GaSb on the GaAs substrate was surely formed in an elliptic quantum ring, any dot of the GaSb extending in the same direction, after directly observed by surface shape observation based on the atomic force microscopy (see (c) of FIG. 1). Then, while the extending direction of these quantum rings 14 was checked by an X-ray diffractometer, it was confirmed that the extending direction was a <011> direction in the GaAs substrate.

Figure 3:
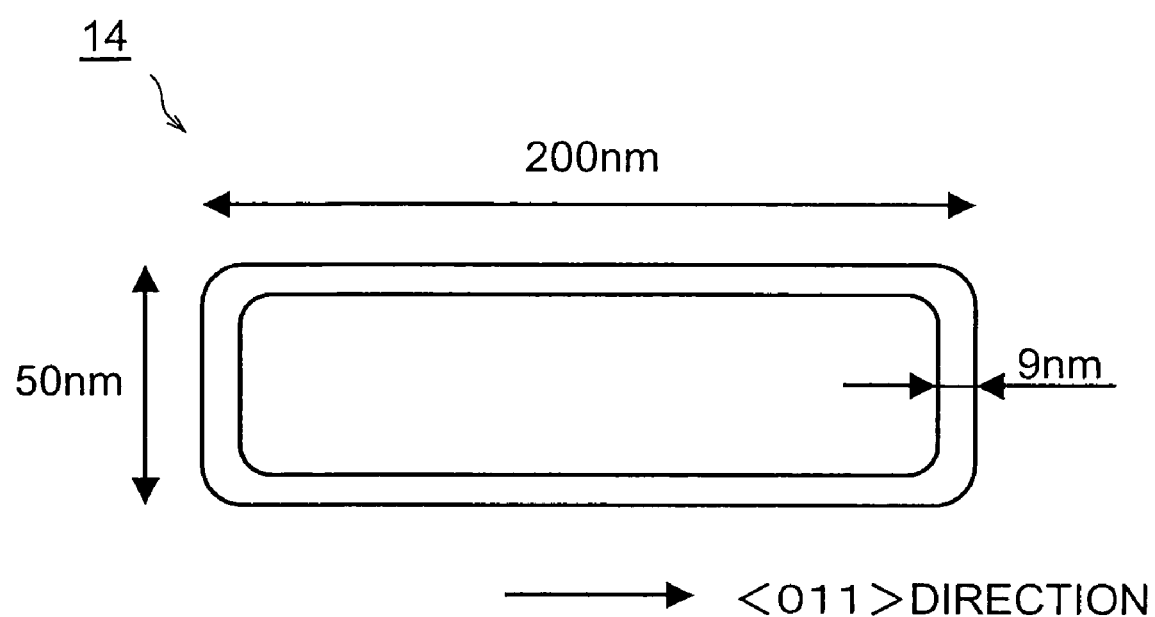
FIG. 3 is a schematically enlarged view of a quantum ring.

Referring to FIG. 3, a dimensional configuration of the quantum ring 14 will be explained. FIG. 3 is a schematically enlarged view of the quantum ring. As shown in FIG. 3, a line width of the quantum ring 14 is about 9 nm. In addition, a length concerning the <011> direction is about 200 nm, which is a long-axis direction and an extending direction of the quantum ring 14, and a length concerning a perpendicular direction (i.e. short-axis direction) to the <011> direction is about 50 nm. That is, a ratio (aspect ratio) of the length concerning the extending direction (<011> direction) of the quantum ring 14 and the one concerning the perpendicular direction to the extending direction is about 4. Further, the height of the quantum ring 14 is about 2.6 nm.

Here, in a conventional technique as represented by Document 4: K. Suzuki et al, "Density Control of GaSb/GaAs Self-assembled Quantum Dots (~25 nm) Grown by Molecular Beam Epitaxy", Jpn. J. Appl. Phys., Vol. 37, Part 2, 1998, pp. 203, quantum dots are formed by a growth rate of 0.1 ML/sec and a growth condition of a V/III ratio of about 5. Also, when InAs is grown on a substrate, in many cases, the growth rate is about 0.1 ML/sec. In particular, in a case where the quantum dots are formed on an active layer of a light-emitting element, in order to form the quantum dots with high quality and high density, the growth rate is often set to 0.01 ML/sec or less. It is known that the quantum dots of the prior art, which is formed by such a low growth rate or a growth condition of a low V/III ratio, is generally formed in a bump-shape (in a flat sphere-shape); however, ring-shaped quantum dots are not confirmed hitherto. In contrast, the inventors newly find that when GaSb is grown on a GaAs substrate on the above-mentioned condition, GaSb becomes a quantum ring 14 in an ellipse-shape.

Though it is possible to form bump-shaped quantum dots into ring-shaped quantum dots, a troublesome treatment such as annealing or thermal treatment is required in such a formation, which may cause increase of extension of manufacturing time and increase of manufacturing cost. In contrast, in accordance with the present invention, since it is unnecessary to go through the above troublesome treatment in the formation of the quantum ring, shortening of the manufacturing time and reduction of the manufacturing cost can be attempted.

As described above, in accordance with the self-assembly technique employing the MBE apparatus, a complicated and high lithography technique or a thermal treatment process are not required in particular, and a Sb-containing compound having a periodic array structure of a submicron order can be easily formed on the GaAs substrate.

Here, it is preferable that a material to be stacked on a GaAs substrate that is a main body of the substrate so as to produce the quantum ring 14 is a Sb-containing compound semiconductor such as GaSb, and the like. This is because in a mode that GaSb grows in a three-dimensional island, typically, distortion energy caused by the lattice mismatch between GaAs and GaSb is stored in proportion to a volume of the island. And, when the distortion energy reaches a critical point, a dislocation will occur and then the distortion energy is relaxed greatly, to thus change the growth mode of GaSb to a two-dimensional mode. That is, the progress speed of the lattice relaxation due to the occurrence of the dislocation becomes a factor to determine the formation of the quantum dots. Further, in the Sb-containing compound semiconductor, the progress speed of the lattice relaxation is fast and the growth mode of the quantum dots changes a three-dimensional island-shaped growth mode to a two-dimensional growth mode at a relatively early stage, and thereby the quantum dots are easily formed in a ring. In contrast, in a material such as As-containing compound semiconductor, the progress speed of the lattice relaxation is late as compared to the Sb-containing compound, and the three-dimensional growth will be sustained, and thereby the quantum dots are easily formed in a bump (semisphere lens shape).

In addition, it is also possible to fabricate a semiconductor substrate on which a plurality of stages of the above-mentioned quantum rings are formed. More specifically, a GaAs buffer layer having a thickness equal to or higher than the height of the quantum ring 14 is stacked, by a similar method to the above-mentioned one, on the semiconductor substrate 16 in which the quantum ring 14 is formed, and further GaSb is grown on the top. Thus, a quantum ring similar to the quantum ring 14 on the GaAs buffer layer can be formed. Thus, the quantum rings are formed at the plurality of stages, which enables to change a degree of polarization of the semiconductor substrate 16.

Figure 4:
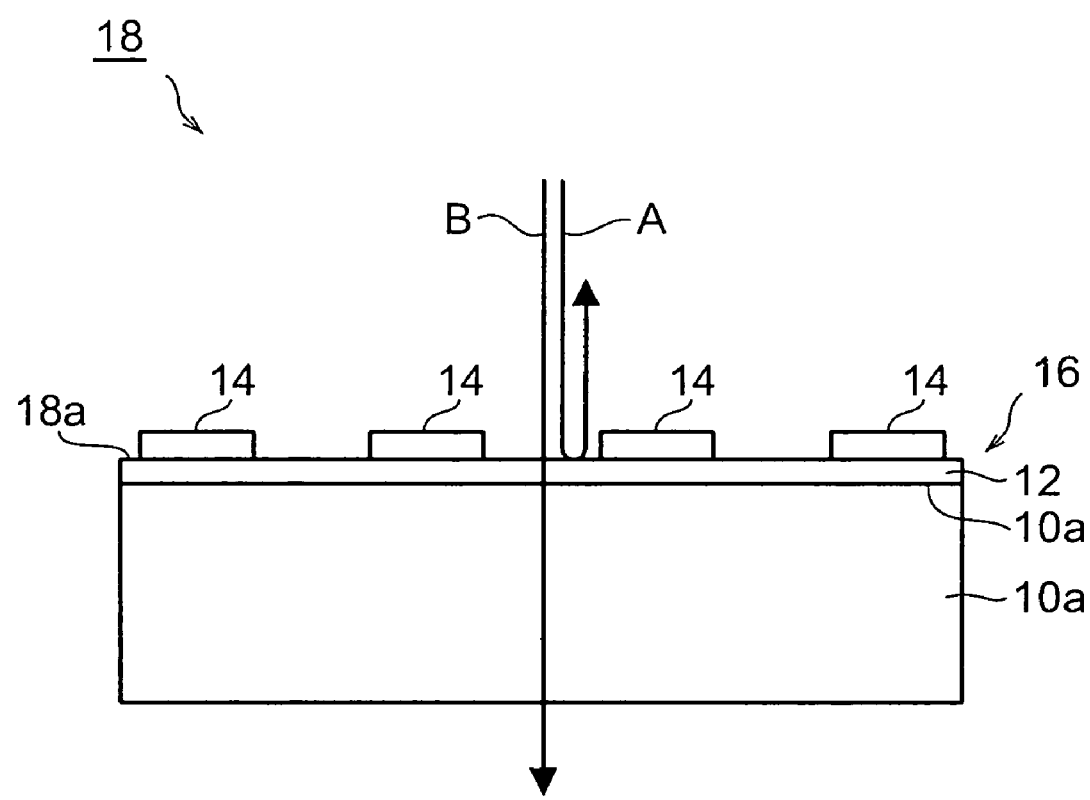
FIG. 4 is a cross-sectional schematic view showing a polarizing element as an application example of a semiconductor substrate according to the present invention.

Next, referring to FIG. 4, a polarizing element (polarization beam splitter) fabricated by use of the above-mentioned semiconductor substrate 16 will be explained. FIG. 4 is a cross-sectional schematic view illustrating a polarizing element as an application example of the semiconductor substrate according to the present invention. The polarizing element 18 shown in FIG. 4 is an optical component that the semiconductor substrate 16 is chipped to a predetermined size to be fabricated.

In FIG. 4, the extending direction of the quantum ring 14 is a perpendicular direction to page space, and a plurality of the quantum rings 14 is aligned periodically along the cross-section.

When a light beam within the wavelength range of 0.87 to 1.7 μm is irradiated to the surface 18a on which the quantum rings 14 of the polarizing element 18 are formed, a polarization component in an extending or thickness direction of the quantum rings 14 (a component denoted by arrow A in FIG. 4) is reflected, while a polarizing component in a perpendicular direction to the extending direction of the quantum rings 14 (a component denoted by arrow B in FIG. 4) is transmitted. Namely, this polarizing element 18 can separate a polarizing component of a light beam having a wavelength of 0.87 to 1.7 μm that is a near-infrared range. That is, the polarizing element 18 is usable as a light source a laser of a communication wavelength band in the near-infrared range. In addition, when a light beam having a wavelength of 0.87 μm or shorter is irradiated thereto, having the band gap energy of GaAs or larger, the irradiated light beam may be absorbed in the GaAs single-crystal substrate 10. Meanwhile, when a light beam having a wavelength of 1.7 μm or more is irradiated thereto, having the band gap energy of GaSb or smaller, the irradiated light beam may transmit the GaAs single-crystal substrate 10 and the quantum rings 14.

In addition, such a polarizing element 18 can be integrally formed together with an existing near-infrared semiconductor laser and/or an optical waveguide structure, thereby achieving great downsizing and lower cost of device units. The semiconductor substrate 16 applied to the above-mentioned polarizing element 18 can form quantum dots relatively easily by self-assembly technique, and also facilitate a stacked structure. Therefore, in the polarizing element 18 fabricated with the semiconductor substrate 16, an improvement of the degree of polarization can be easily attempted.

Further, a quantum computer that executes communication or information processing which is different from a conventional one by applying directly thereto a basic property of quantum mechanics is composed of a quantum bit taking a superposition on quantum mechanics of two states generally, a rotation gate changing a superposed state coherently, and a Controlled-Not gate changing the quantum correlation between quantum bits. The circuit in this quantum computer is configured by optical elements, and polarization of photons is used. For this reason, when an integrated hybrid element combining with a light source, a waveguide and so on is formed by use of the polarizing element 18, and this hybrid element is applied to the circuit of the quantum computer, downsizing and lower cost of the computer system can be attempted. The polarizing element 18 has an excellent degree of polarization, and thereby is usable as a simple and compact element capable of operating in a near-infrared region.

As described above in detail, a plurality of quantum rings 14 are extended along in the substantially same direction on the substrate surface of the semiconductor substrate 16. When a light beam is irradiated to the substrate surface, the polarized component in the extending direction of the quantum rings 14 is reflected, while the polarized component in the perpendicular direction to the extending direction of the quantum rings 14 is transmitted. Thus, this semiconductor substrate 16 is applicable to the polarizing element 18 for transmitting only one polarized component selectively.

It is noted that an aspect ratio of each of the quantum rings 14 is selected from the range of 2 or more but 5 or less. Namely, in the quantum ring having an almost true circle, such that the aspect ratio of the quantum ring is 1 or more and less than 2, separation of polarized components is difficult, and thereby the fabricated polarizing element does not function sufficiently. In contrast, when the aspect ratio of the quantum ring is attempted to be larger than 5, there occurs the necessity of depositing a large amount of GaSb on a GaAs substrate. This increase of the deposition amount may cause deterioration of the polarizing capacity due to enlargement of the quantum ring. Therefore, it is difficult to achieve necessary and sufficient separation of polarized light in the polarizing element with the quantum ring having an aspect ratio larger than 5.

The present invention enables various modifications without being restricted by the aforementioned embodiment. For example, the shape of the quantum ring may be flat ellipse, rectangular curving at four corners, or the like, which is not limited to ellipse. In addition, the aspect ratio of the quantum ring can be appropriately changed within the range of 2 or more but 5 or less, which is not limited to 4. Further, a plurality of the quantum rings may be somewhat inclined or misaligned in the extending direction when extending in the substantially same direction.

In addition, though it is discussed in a case where the quantum ring is composed of GaSb in the above-mentioned embodiment, the compound semiconductor constituting the quantum ring may be a Sb-containing compound semiconductor such as a two-dimensional mixed crystal or a three-dimensional mixed crystal including In and/or Al, for example. Further, the constitutional material of the single-crystal substrate may be appropriately selected from other Group III-V compound semiconductors or the other compound semiconductors, which is not limited to GaAs of Group III-V compound semiconductors. Though a growing method of the quantum ring is shown by the one of solid-source MBE apparatus only, which may be another method employing gas-source MBE apparatus.

As described above, in accordance with the present invention, preferred semiconductor substrates for fabrication of devices can be obtained.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor substrate comprised of a first compound semiconductor, and having a surface on which a plurality of quantum rings comprised of a second compound semiconductor different from the first compound semiconductor are provided,
   wherein each of said quantum rings has an elongated shape with an aspect ratio of 2 or more but 5 or less, and extends in a substantially same direction.

2. A semiconductor substrate according to claim 1, wherein the first compound semiconductor includes a Group III-V compound semiconductor.

3. A semiconductor substrate according to claim 1, wherein the first compound semiconductor includes GaAs.

4. A semiconductor substrate according to claim 1, wherein the second compound semiconductor includes a Group III-V compound semiconductor.

5. A semiconductor substrate according to claim 1, wherein the second compound semiconductor includes GaSb.

6. A semiconductor substrate according to claim 1, where each of said quantum rings has a shape of an elongated rectangle with rounded corners.

7. A semiconductor substrate according to claim 1, wherein the substantially same direction in which each of said quantum rings extends is a <011> direction in the semiconductor substrate.

8. A semiconductor substrate according to claim 1, wherein the substantially same direction in which each of said quantum rings extends is a long-axis direction of said quantum rings.

* * * * *